United States Patent
Wilk et al.

(10) Patent No.: US 6,291,282 B1
(45) Date of Patent: Sep. 18, 2001

(54) METHOD OF FORMING DUAL METAL GATE STRUCTURES OR CMOS DEVICES

(75) Inventors: Glen D. Wilk, Dallas, TX (US); Scott R. Summerfelt, Cupertino, CA (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/500,330

(22) Filed: Feb. 8, 2000

Related U.S. Application Data

(60) Provisional application No. 60/121,786, filed on Feb. 26, 1999.

(51) Int. Cl.[7] .................................................. H01L 21/8283
(52) U.S. Cl. ............................ 438/203; 438/199; 438/584
(58) Field of Search ..................................... 438/203, 199, 438/584, 202, 204, 595

(56) References Cited

U.S. PATENT DOCUMENTS

| | | | |
|---|---|---|---|
| 6,027,961 | * | 2/2000 | Maiti et al. ............................ 438/199 |
| 6,043,157 | * | 3/2000 | Gardner et al. . | |
| 6,066,533 | * | 2/2000 | Yu ........................................ 438/275 |
| 6,130,123 | * | 10/2000 | Liang et al. ........................... 438/217 |

\* cited by examiner

*Primary Examiner*—Caridad Everhart
(74) *Attorney, Agent, or Firm*—W. James Brady, III; Frederick J. Telecky, Jr.

(57) ABSTRACT

An embodiment of the instant invention is a method of forming a first transistor having a first gate electrode and a second transistor having a second gate electrode on a semiconductor substrate, the method comprising the steps of: forming a conductive material (step 216 of FIG. 2) insulatively disposed over the semiconductor substrate, the conductive material having a work function; and altering a portion of the conductive material (step 218 of FIG. 2) so as to change the work function of the altered conductive material, the conductive material to form the first gate electrode and the altered conductive material to form the second gate electrode. Preferably, the first transistor is an NMOS device, the second transistor is a PMOS device, and the first transistor and the second transistor form a CMOS device. The conductive material is, preferably, comprised of a conductor selected from the group consisting of: Ta, Mo, Ti and any combination thereof. Preferably, the step of altering a portion of the conductive material is comprised of: subjecting the portion of the conductive material to a plasma which incorporates a nitrogen-containing gas.

9 Claims, 3 Drawing Sheets

METHOD OF FORMING DUAL METAL GATE STRUCTURES OR CMOS DEVICES

This application claims priority under 35 USC §119(e)(1) of provisional application number 60/121,786 filed Feb. 26, 1999.

CROSS-REFERENCE TO RELATED PATENT/PATENT APPLICATIONS

The following commonly assigned patents and patent applications are hereby incorporated herein by reference:

| Pat. No. /Ser. No. | Issue/Filing Date | TI Case No. |
|---|---|---|
| 6,063,677 | 5/16/2000 | TI-22027 |
| 6,063,675 | 5/16/2000 | TI-22748 |
| 09/396,642 | 9/15/1999 | TI-24776 |

FIELD OF THE INVENTION

The instant invention pertains to semiconductor device fabrication and processing and more specifically to a method of fabricating a metal gate structures for CMOS devices.

BACKGROUND OF THE INVENTION

As electronic devices become more and more complex, the need for greater and greater numbers of transistors on the device is increased. In addition, power consumption needs to be reduced while the speed of the devices needs to be increased. At least part of the answer to these requirements involves reducing the area that each transistor occupies. However, this may adversely affect one or more of the other requirements. More specifically, as the transistors are scaled down, the gate structure is also scaled down and this increases the resistance of the gate. Hence, the power consumption is increased and the speed of the device is decreased.

Several attempts to reduce the sheet resistivity of the gate structures have been made in the past. First, the polycrystalline silicon was more heavily doped with either n-type or p-type dopants. Then, the upper portion of the gate was silicided with tungsten or titanium. Presently, cobalt silicide is being used so as to reduce the resistivity for smaller geometries. The next likely solution will involve metal gate structures.

Metal gate structures provide lower sheet resistivity virtually irrespective of the width of the gate. However, many metal gate materials have problems which must be overcome before they can be implemented in a standard semiconductor processing flow. One problem is that many metals are unstable next to $SiO_2$, which is commonly used for the gate dielectric layer. Another problem is that many metals become less conductive when they are oxidized.

Aluminum and tungsten have been used to form gate structures. Aluminum may not be a good choice due to the problems stated above and tungsten has a work function which lies between the work function of p-type polycrystalline silicon (poly) and n-type poly. A problem with tungsten, though, is that as the applied voltages become smaller and smaller the fact that the work function is midgap and is unchangeable (as compared to n-type and p-type poly), it may become difficult to provide a gate potential greater than the threshold voltage of the PMOS and NMOS device.

In an attempt to over come this threshold voltage problem using one midgap metal for both PMOS and NMOS device, aluminum has been utilized for one type of devices while platinum is used for the other type of devices. However, platinum is expensive and difficult to work with and aluminum suffers from the problems listed above. Hence, a need exists for a gate electrode material whose conductivity is not relative to the gate width and which has different work functions for PMOS devices and NMOS devices.

SUMMARY OF THE INVENTION

An embodiment of the instant invention is a method of forming a first transistor having a first gate electrode and a second transistor having a second gate electrode on a semiconductor substrate, the method comprising the steps of: forming a first conductive material insulatively disposed over a first portion of the semiconductor substrate, the first conductive material having a first work function; forming a second conductive material insulatively disposed over a second portion of the semiconductor substrate, the second conductive material is comprised of the first conductive material but has a second work function which is different than the first work function; and wherein the first conductive material is used to form the first gate electrode and the second conductive material is used to form the second gate electrode. In one alternative embodiment, the first conductive material is comprised of Ta and the second conductive material is comprised of $Ta_xN_y$. In another alternative embodiment, the first conductive material is comprised of Mo and the second conductive material is comprised of $Mo_xN_y$. In yet another alternative embodiment, the first conductive material is comprised of Ti and the second conductive material is comprised of $Ti_xN_y$.

Another embodiment of the instant invention is a method of forming a first transistor having a first gate electrode and a second transistor having a second gate electrode on a semiconductor substrate, the method comprising the steps of: forming a conductive material insulatively disposed over the semiconductor substrate, the conductive material having a work function; and altering a portion of the conductive material so as to change the work function of the altered conductive material, the conductive material to form the first gate electrode and the altered conductive material to form the second gate electrode. Preferably, the first transistor is an NMOS device, the second transistor is a PMOS device, and the first transistor and the second transistor form a CMOS device. The conductive material is, preferably, comprised of a conductor selected from the group consisting of: Ta, Mo, Ti and any combination thereof. Preferably, the step of altering a portion of the conductive material is comprised of: subjecting the portion of the conductive material to a plasma which incorporates a nitrogen-containing gas.

BRIEF DESCRIPTION OF THE DRAWINGS

Like reference numerals or symbols in different figures refer to corresponding structures unless indicated otherwise.

The figures are provided merely to illustrate the concepts of the instant invention. The figures are not drawn to scale.

DETAILED DESCRIPTION OF THE DRAWINGS

In essence, the instant invention involves a CMOS device and a method for making the device which incorporates a metal gate electrode for either the NMOS device or the PMOS device and an altered version of the metal for the gate electrode of the other device, PMOS device or NMOS device (respectively). Preferably, the instant invention involves forming the gate electrode of the NMOS device, at least in part, of tantalum and the gate electrode of the PMOS device, at least in part, of tantalum nitride. Hence, the instant invention involves the same base metal, for example, tantalum, but uses an altered form of the base metal for one of the devices gate electrode. The instant invention may be fabricated using a disposable gate methodology (basically illustrated in FIGS. 2 and 3a–3e) or with the traditional gate formation methodology (basically illustrated in FIG. 1).

Figure 1:
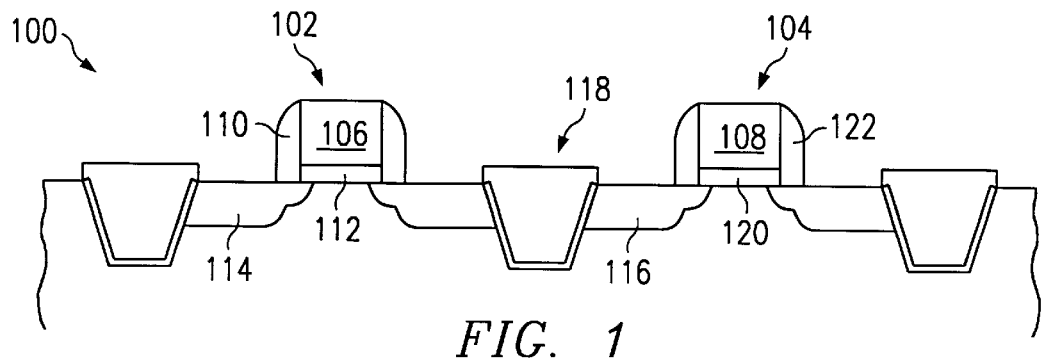
FIG. 1 is a cross-sectional diagram of a partially fabricated CMOS device of the method of one embodiment of the instant invention.

Referring to FIG. 1, the CMOS device 100 of the instant invention can be fabricated using traditional techniques or it may be fabricated using the disposable gate methodology illustrated in FIGS. 2 and 3a–3e. The traditional methodology of forming gate structures involves forming isolation structures 118 which may be LOCOS type isolation structures, shallow trench isolation structures (STI—shown in FIG. 1 as isolation structures 118), or doped isolation regions. A gate insulator layer is formed along with an overlying gate conductor layer. In the instant invention, the gate insulating layer is preferably comprised of silicon dioxide, silicon nitride, a high dielectric constant material (such as PZT, BST, tantalum pentoxide, or other commonly used material), a silicate, a combination of one or more of the above, an oxynitride, or a stack thereof. The gate conductor layer is preferably comprised of a metal which can be selectively altered so as to change its work function. Examples of these are titanium, tantalum, molybdenum, or other similar metal. Either prior to the patterning and etching of the gate structure or after these steps, a portion of the gate conductor is converted so as to change its work function. Preferably, this is accomplished by either nitriding this portion of the conductive layer (or a portion of the already patterned and etched gate structures) or using a metal/nitride/metal stack on this portion of the gate structures so that annealing this layer of metal will distribute nitrogen throughout. Since the conductive material is relatively thin (preferably on the order of 5 to 50 nm), these portions to be nitrided can be nitrided by annealing this portion of the layer (or these particular gate conductors which are already patterned and etched) in a nitrogen-containing atmosphere (such as ammonia), or subjecting the selected portions of the conductive layer or gate structures to a nitrogen-containing gas (preferably $N_2$) which is incorporated into a plasma. However, instead of nitriding portions of an already formed conductive layer, the PMOS gate structure can be formed separately from the NMOS gate structure. Hence, one gate structure can be formed of Ta, Mo or Ti and the other can be co-deposited with either Ta, Mo or Ti and a nitrogen-containing source (such as $N_2$). Alternatively, the nitrided version can be comprised of a stack of either Ta, Mo or Ti and a nitrogen-containing layer (such as TaN, MoN or TiN) and then annealed so as to distribute the nitrogen throughout these gate structures. Preferably, the gate conductor 106 of the NMOS device 102 will be comprised of Ta, Mo or Ti and the gate conductor 108 of PMOS device 104 will be comprised of nitrogen and either Ta, Mo, Ti, or a combination thereof.

After the gate structures are formed, source/drain extensions (if used) and the source/drain regions 114 and 116 are formed. Standard processing follows after this.

Figure 2:
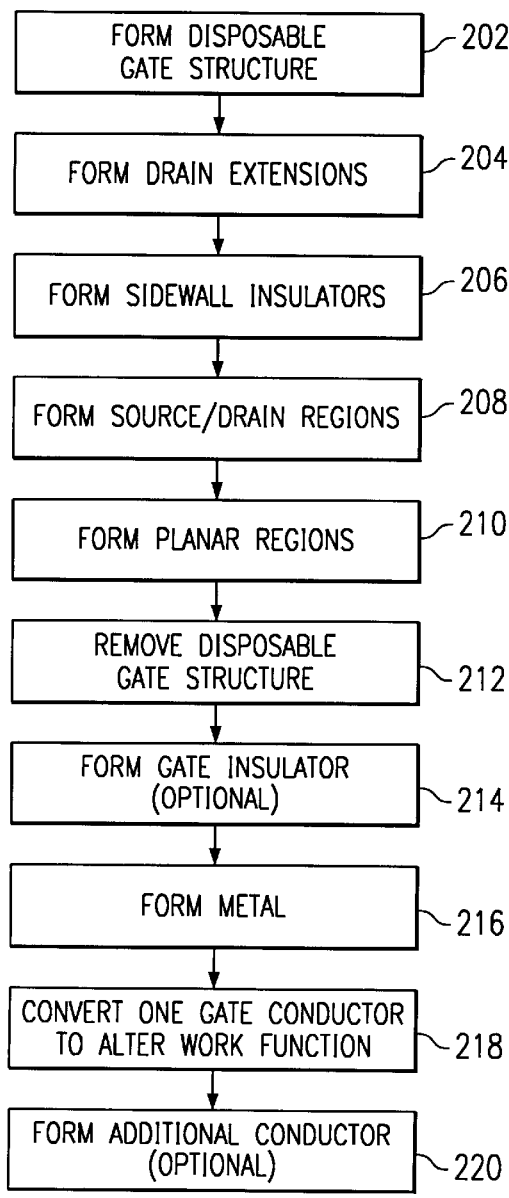
FIG. 2 is a flow diagram of a method of an embodiment of the instant invention.
Figure 3A:
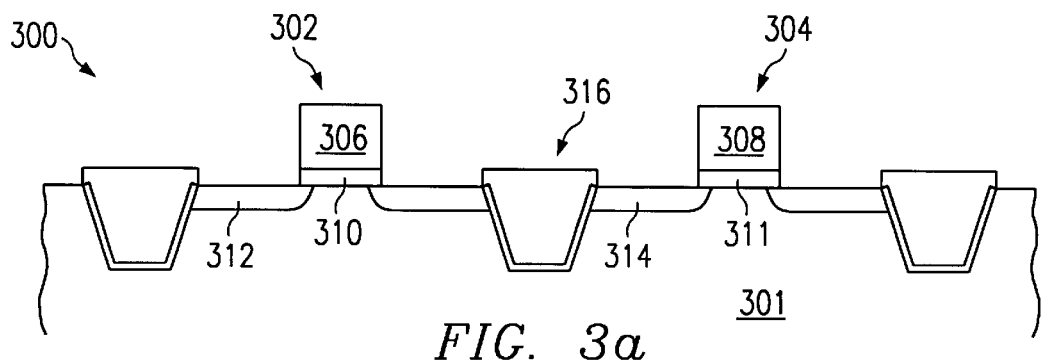
FIGS. 3a–3e are cross-sectional views of a partially-fabricated semiconductor device using the method of the instant invention as illustrated in FIG. 2.

Another embodiment of the instant invention is illustrated in FIGS. 2 and 3a–3e. The details of this embodiment are applicable to the above embodiment. Referring to step 202 of FIG. 2 and FIG. 3a, isolation structures 316 are formed. Isolation structures 316 may be comprised of LOCOS, STI, or doped isolation regions. First and second dummy layers are formed, next. The first dummy layer may be comprised of the material to form the gate insulator or it may simply be a dummy layer. If the first dummy layer is comprised of the gate insulating material (preferably silicon dioxide, silicon nitride, an oxynitride, BST, tantalum pentoxide, a silicate, or other suitable gate insulating material) then this layer will not be later removed and gate insulating layer 324 will not be formed in step 214. The first and second dummy layers are patterned and etched so as to form the dummy gate structures for PMOS device 302 and NMOS device 304. The dummy gate structure is comprised of two layers. If the bottom layer (layers 310 and 311) are not actually comprised of the gate insulating material, then it should be comprised of a material that can be removed without damaging the substrate 301 or adversely affect the surrounding structures when it is removed in step 212. If the first layer is a removable layer, then the first and second layers may be comprised of the same material. Hence, structures 310 and 306 and 311 and 308 would be comprised of the same materials. Preferably, these structures are comprised of a material that, when removed, will not substantially adversely affect the underlying substrate 301 or the surrounding structures (such as sidewall insulators 318 and 319 and planar insulating material 322). Therefore, structures 310, 306, 311, and 308 may be comprised of silicon nitride, silicon dioxide, polycrystalline silicon, silicon germanium, or any other material that can be removed selective to the underlying silicon substrate and the oxide or nitride sidewall insulators.

Referring to step 204 of FIG. 2, source/drain extensions are formed (if at all) using the isolation structures 316 and disposable gate structures (structures 310/306 and 311/308) to align to. The source/drain extensions 312 of PMOS device 302 are preferably comprised of a p-type dopant (such as boron) and the source/drain extensions 314 of NMOS device 304 are preferably comprised of n-type dopants (such as phosphorous or arsenic).

Figure 3B:
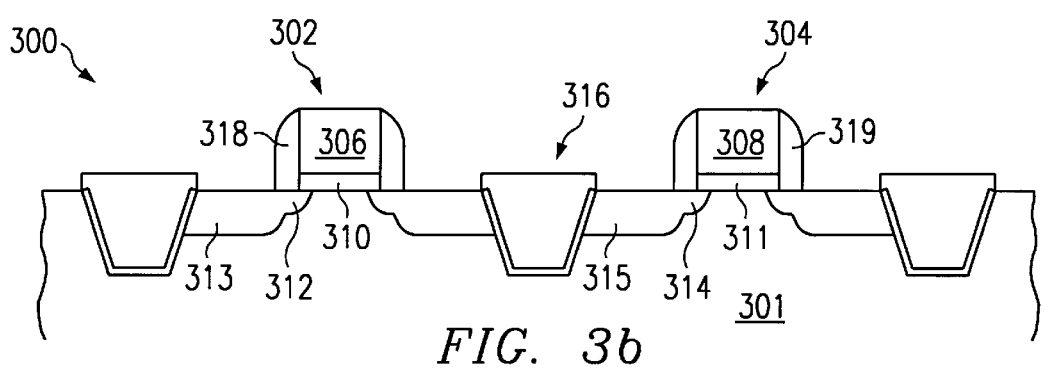

Referring to step 206 of FIG. 2 and FIG. 3b, sidewall insulators 318 and 319 are formed. Sidewall insulators 318 and 319 may be comprised of thermally grown silicon oxide, deposited silicon oxide, silicon nitride, an oxynitride, or a combination or stack thereof. Referring to step 208, source/drain regions 313 and 315 are formed, next. Preferably, source/drain regions 313 are formed by doping boron into the substrate, and source/drain regions 315 are formed by doping arsenic and/or phosphorous into the substrate.

Figure 3C:
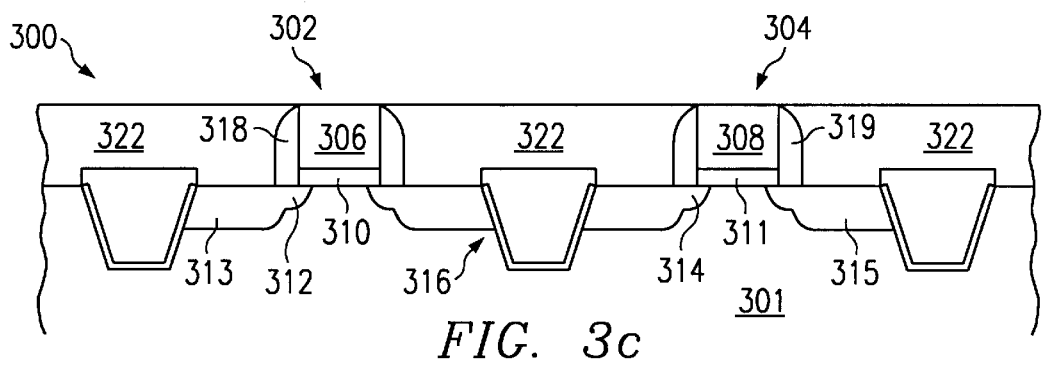

Referring to step 210 of FIG. 2 and FIG. 3c, insulating layer 322 is formed. Preferably, insulating layer 322 is either flowed onto the wafer so as to have its top surface at roughly the same height as the top of the disposable gate structure and sidewall insulators. However, insulating layer 322 may be deposited or flowed onto the wafer and then polished down to be co-extensive with the disposable gate structure and sidewall insulators using chemical-mechanical polishing (CMP). Preferably, insulating layer is comprised of a flowable oxide (such as aerogel, xerogel, or HSQ), BPSG, TEOS, PETEOS, PSG, FSG, or other silicon oxide material.

Figure 3D:
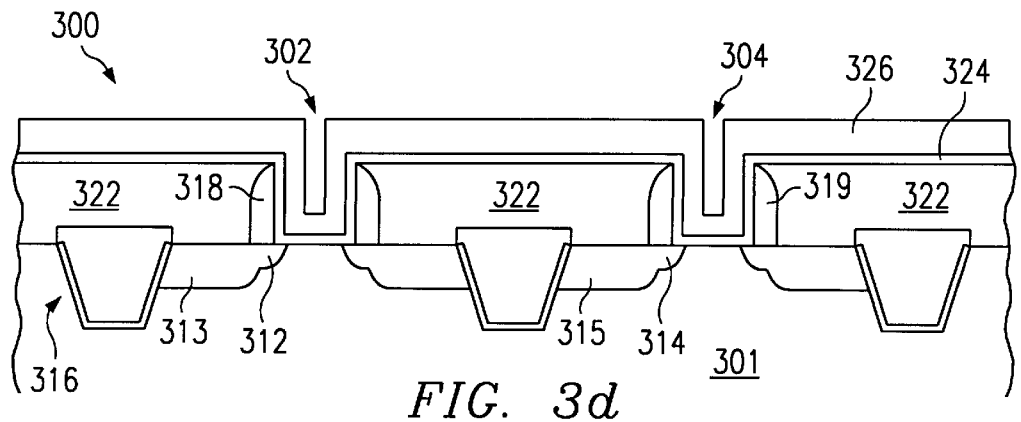
Figure 3E:
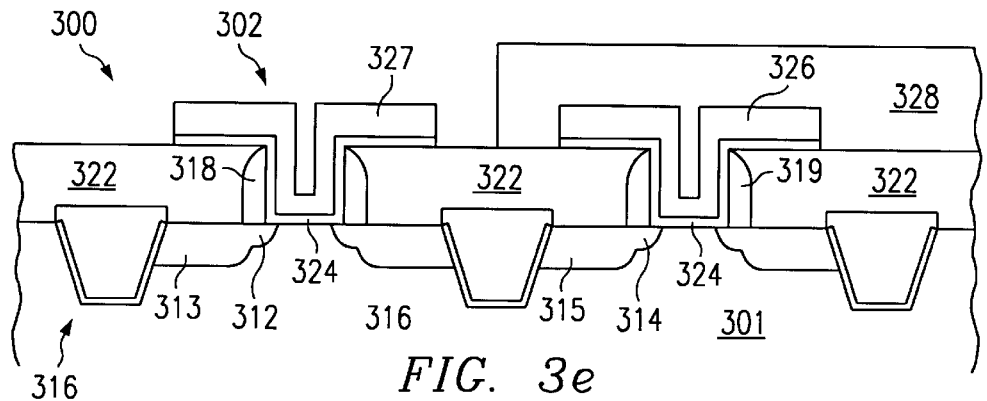
Figure 4:
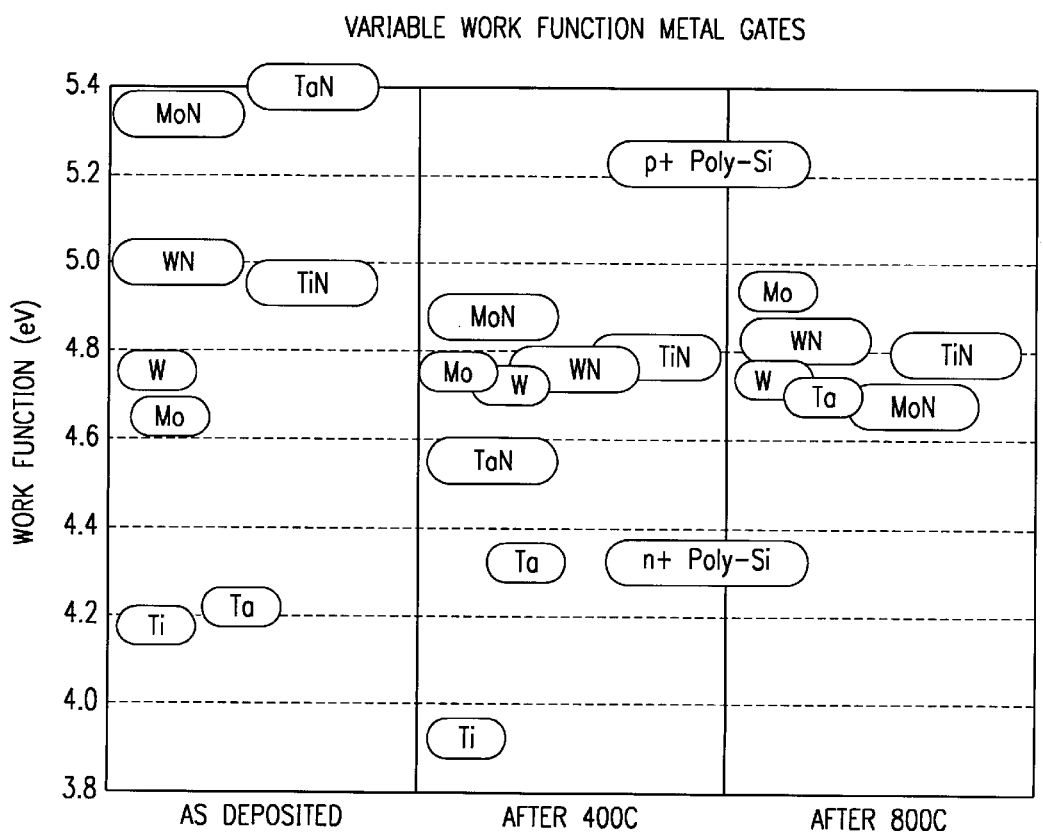
FIG. 4 is a chart illustrating the work functions of different materials.

Referring to FIG. 3d and step 212 of FIG. 2, the disposable gate structures (structures 306 and 308 and structures 310 and 311 if they are not comprised of the gate insulating material) are removed. Preferably, this is accomplished so that neither the substrate 301, sidewall insulators 318 and 319, insulating layer 322 nor the gate insulators 310 and 311 (if they are formed of the gate insulating material which is desired for these devices) are substantially degraded or etched away.

Referring to step 214 of FIG. 2, if structures 310 and 311 are not comprised of the desired gate material and are removed in step 212, gate insulating layer 324 is formed. Gate insulating material is preferably comprised of silicon dioxide, silicon nitride, an oxynitride, a silicate, or a high-k material (such as BST, tantalum pentoxide, or other suitable material).

Conductor 326 is formed in step 216 of FIG. 2. Preferably, conductor 326 is comprised of Ta, Mo, Ti or other suitable conductor which can be selectively altered so as to selectively change its work function. However, a portion of conductor 326 may be comprised of Ta, Mo or Ti while the other portion is comprised of an altered form of Ta, Mo or Ti (preferably a nitrided version). The altered form can be one in which Ta, Mo or Ti is co-deposited with nitrogen or it can be a stack of Ta, Mo and/or Ti and a nitride. Preferably, conductor 326 is comprised of either Ta, Mo or Ti and is later altered. Conductor 326 should be thick enough so that its work function defines the functioning of the gate. Preferably, the thickness of conductor 326 is on the order of around 5 to 50 nm (roughly around 8 to 10 unit cells or more in thickness).

Either prior to the patterning and etching of conductor 326 and insulating layer 324 or after this step, one portion (or one of the gate conductors—conductor 327) is altered so as to change its work function. This can be accomplished by masking off the portion of conductor 326 (or conductor 329) and subjecting the exposed portion of conductor 326 or conductor 327 to the altering agent. Preferably, this alteration occurs by subjecting the wafer to a nitrogen gas (preferably $N_2$) which is incorporated in a plasma. This step preferably is performed at an ambient temperature or around 300 to 500° C. for around 20 seconds to 2 minutes. The goal of this step is to substantially completely convert the Ta, Mo or Ti into $Ta_xN_y$, $Mo_xN_y$, or $Ti_xN_y$.

Once this alteration is accomplished and the gate structures are patterned and etched, another conductive material may be formed so as to fill the remaining portion of the gate electrode (if necessary). Preferably, this additional conductive material is comprised of tungsten, aluminum or other conductive material.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of forming a first transistor having a first gate electrode and a second transistor having a second gate electrode on a semiconductor substrate, said method comprising the steps of:

forming first and second disposable gate structures insulatively disposed over the semiconductor substrate at the locations of the first and second transistors, respectively;

forming source/drain regions of a first conductivity type on opposite sides of the first disposable gate structure;

forming source/drain regions of a second conductivity type on opposite sides of the second disposable gate structure;

forming an insulating layer over the substrate, the insulating layer having a top surface substantially coplanar with top surfaces of the first and second disposable gate structures;

removing the first and second disposable gate structures;

forming a first conductive material insulatively disposed over the semiconductor substrate at the location from which the first disposable gate structure was removed, said first conductive material having a first work function; and forming a second conductive material insulatively disposed over the semiconductor substrate at the location from which the second disposable gate structure was removed, said second conductive material being comprised of said first conductive material but having a second work function different from said first work function;

wherein said first conductive material forms said first gate electrode and said second conductive material forms said second gate electrode.

2. The method of claim 1, wherein said first conductive material is comprised of tantalum and said second conductive material is comprised of tantalum nitride.

3. The method of claim 1, wherein said first conductive material is comprised of molybdenum and said second conductive material is comprised of molybdenum nitride.

4. The method of claim 1, wherein said first conductive material is comprised of titanium and said second conductive material is comprised of titanium nitride.

5. The method of claim 1, wherein the step of forming the first conductive material comprises forming a conductive material insulatively disposed over the semiconductor substrate after the removing step, said conductive material having the first work function;

and wherein the step of forming the second conductive material comprises altering a portion of the conductive material so as to change its work function to the second work function.

6. The method of claim 5, wherein said first transistor is an NMOS device and said second transistor is a PMOS device.

7. The method of claim 6, wherein said first transistor and said second transistor form a CMOS device.

8. The method of claim 5, wherein said conductive material is comprised of a conductor selected from the group consisting of: Ta, Mo, Ti and any combination thereof.

9. The method of claim 5, wherein said step of altering a portion of said conductive material is comprised of: subjecting said portion of said conductive material to a plasma which incorporates a nitrogen-containing gas.

* * * * *